United States Patent
Seo et al.

(10) Patent No.: US 9,425,419 B2
(45) Date of Patent: Aug. 23, 2016

(54) ORGANIC LIGHT-EMITTING DISPLAY APPARATUS AND METHOD OF MANUFACTURING THE SAME

(71) Applicant: Samsung Display Co., LTD., Yongin, Gyeonggi-do (KR)

(72) Inventors: Jun-Seon Seo, Yongin (KR); Jong-Hyun Choi, Yongin (KR); Yong-Duck Son, Yongin (KR); Jin-Wook Seo, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 297 days.

(21) Appl. No.: 13/965,179

(22) Filed: Aug. 12, 2013

(65) Prior Publication Data

US 2014/0291625 A1    Oct. 2, 2014

(30) Foreign Application Priority Data

Mar. 27, 2013    (KR) .................. 10-2013-0033087

(51) Int. Cl.
| | |
|---|---|
| *H01L 27/32* | (2006.01) |
| *H01L 27/12* | (2006.01) |
| *H01L 51/05* | (2006.01) |
| *H01L 29/423* | (2006.01) |
| *H01L 29/786* | (2006.01) |

(52) U.S. Cl.
CPC ........... *H01L 51/055* (2013.01); *H01L 27/124* (2013.01); *H01L 27/1259* (2013.01); *H01L 27/1288* (2013.01); *H01L 27/32* (2013.01); *H01L 27/3262* (2013.01); *H01L 29/42384* (2013.01); *H01L 29/78627* (2013.01); *H01L 27/3248* (2013.01); *H01L 2227/323* (2013.01)

(58) Field of Classification Search
CPC ................... H01L 27/3258; H01L 27/124
See application file for complete search history.

(56) References Cited

U.S. PATENT DOCUMENTS

| 8,378,353 | B2 | 2/2013 | Lee et al. | |
|---|---|---|---|---|
| 2006/0102899 | A1* | 5/2006 | Lee ................. | H01L 27/12 257/59 |
| 2011/0108848 | A1* | 5/2011 | Lee et al. ................. | 257/72 |
| 2011/0303922 | A1* | 12/2011 | Cho et al. ................. | 257/71 |

FOREIGN PATENT DOCUMENTS

| KR | 10-2004-0000629 A | 1/2004 |
|---|---|---|
| KR | 10-2004-0037889 A | 5/2004 |
| KR | 10-2012-0032904 A | 4/2012 |

* cited by examiner

*Primary Examiner* — Ha Tran T Nguyen
*Assistant Examiner* — Aaron Dehne
(74) *Attorney, Agent, or Firm* — Lewis Roca Rothgerber Christie LLP

(57) ABSTRACT

Provided is an organic light-emitting display apparatus including a substrate; and a plurality of pixels on the substrate, wherein each of the pixels comprise: an organic light-emitting device comprising a first electrode, a second electrode, and an intermediate layer between the first electrode and the second electrode, wherein the intermediate layer comprises an organic emission layer; a driving transistor configured to drive the organic light-emitting device; and a switching transistor electrically coupled to the driving transistor, wherein the gate electrode of the driving transistor comprises a first conductive layer, and a second conductive layer between the first conductive layer and the active layer of the driving transistor and has a smaller size than the first conductive layer, and the gate electrode of the switching transistor comprises a same material as the first conductive layer.

20 Claims, 8 Drawing Sheets

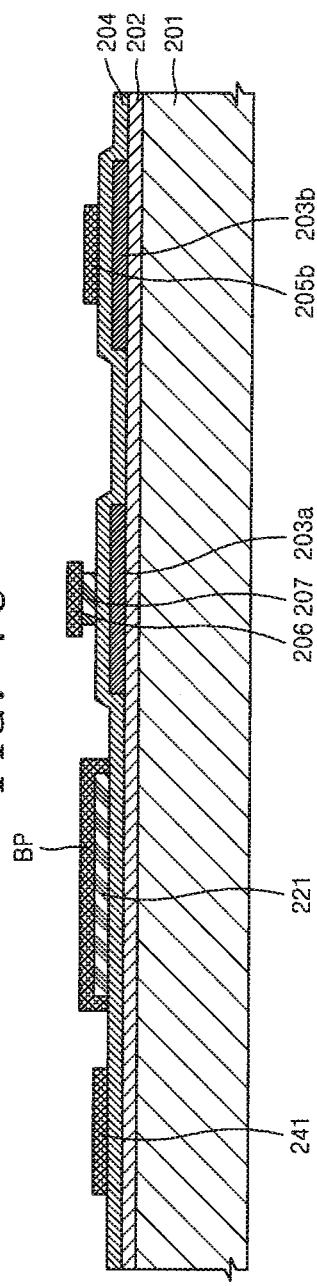
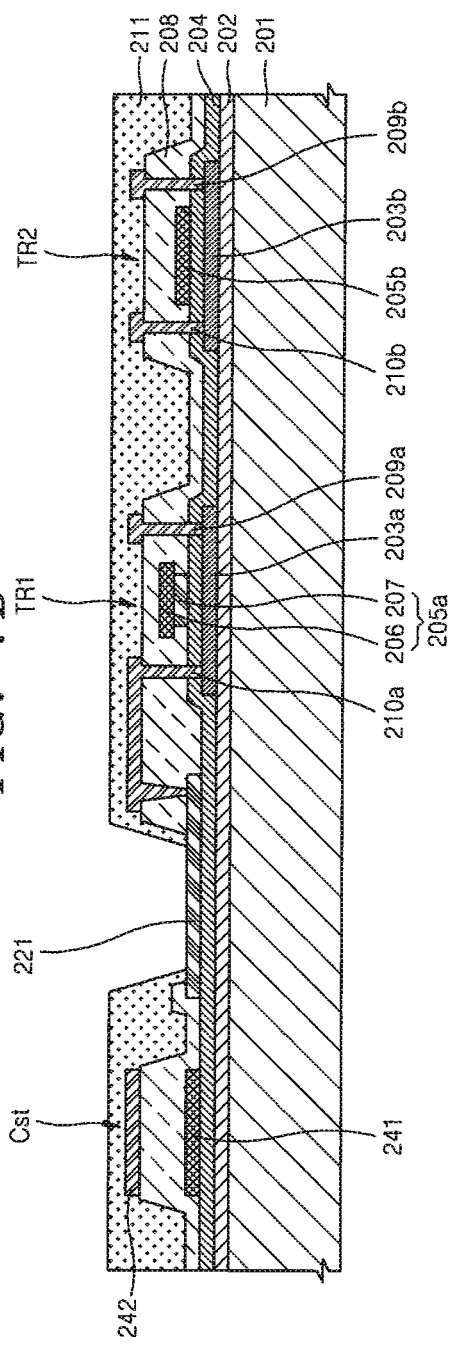

ORGANIC LIGHT-EMITTING DISPLAY APPARATUS AND METHOD OF MANUFACTURING THE SAME

CROSS-REFERENCE TO RELATED APPLICATIONS

This application claims priority to and the benefit of Korean Patent Application No. 10-2013-0033087, filed in the Korean Intellectual Property Office on Mar. 27, 2013, the entire content of which is incorporated herein by reference.

BACKGROUND

1. Field

Aspects of the present invention relate to an organic light-emitting display apparatus.

2. Description of the Related Art

Recently, thin film-type portable flat panel display apparatuses have become more popular as display apparatuses. From among flat panel display apparatuses, an organic light-emitting display apparatus is a self-emission display apparatus that has a relatively wide viewing angle, a relatively high contrast ratio, and a relatively high response speed compared to other display apparatus technologies. Due to these characteristics, the organic light-emitting display apparatus is getting attention as a next-generation display apparatus.

An organic light-emitting display apparatus includes an intermediate layer, a first electrode, and a second electrode. The intermediate layer includes an organic emission layer, and when a voltage is applied to the first electrode and the second electrode, the organic emission layer generates visible light.

Also, the organic light-emitting display apparatus may further include one or more transistors (TR) that drive the organic light-emitting display apparatus, and in particular, one pixel may include a switching TR and a driving TR.

In this regard, because characteristics of a switching TR and a driving TR included in one pixel largely affect driving of an organic light-emitting display apparatus, there is a need to effectively control the switching TR and the driving TR.

However, it is difficult to control the switching TR and the driving PR included in one pixel without an additional process, thereby limiting an improvement in image-quality characteristics of an organic light-emitting display apparatus.

SUMMARY

Embodiments of the present invention provide an organic light-emitting display apparatus for improving an image quality and a method of manufacturing an organic light-emitting display apparatus.

According to an aspect of the present invention, there is provided an organic light-emitting display apparatus including a plurality of pixels on the substrate, wherein each of the pixels includes: an organic light-emitting device comprising a first electrode, a second electrode, and an intermediate layer between the first electrode and the second electrode, wherein the intermediate layer comprises an organic emission layer; a driving transistor configured to drive the organic light-emitting device and comprising an active layer, a gate electrode, a source electrode, and a drain electrode; and a switching transistor electrically coupled to the driving transistor and comprising an active layer, a gate electrode, a source electrode, and a drain electrode, wherein the gate electrode of the driving transistor comprises a first conductive layer, and a second conductive layer between the first conductive layer and the active layer of the driving transistor and has a smaller size than the first conductive layer, and the gate electrode of the switching transistor comprises a same material as the first conductive layer.

The first conductive layer may protrude over opposite sides of the second conductive layer.

An overlapping region of the second conductive layer and the active layer of the driving transistor may be smaller than an overlapping region of the first conductive layer and the active layer of the driving transistor.

The second conductive layer may include a transmissive conductive material.

The transmissive conductive material may include ITO, IZO, ZnO, $In_2O_3$, IGO, or AZO.

An electrical resistance of the first conductive layer may be smaller than an electric resistance of the second conductive layer.

Each of the pixels may further include a capacitor.

The capacitor may include a first capacitor electrode and a second capacitor electrode, and the first capacitor electrode may be include the same material as the first conductive layer, and the second capacitor electrode may include a same material as the source electrode and drain electrode of the driving transistor or the source electrode and drain electrode of the switching transistor.

The first electrode and the second conductive layer of the driving transistor may be formed on a same layer.

The first electrode may be formed of a same material as in the second conductive layer of the driving transistor.

A portion of the active layer of the driving transistor that corresponds to the first conductive layer and does not correspond to the second conductive layer may be a non-doped portion.

According to another aspect of the present invention, there is provided a method of manufacturing an organic light-emitting display apparatus, the organic light-emitting display apparatus including a plurality of pixels on a substrate, the method including: forming one of the pixels, the forming of one of the pixels includes: forming an organic light-emitting device including a first electrode, a second electrode, and an intermediate layer between the first electrode and the second electrode, the intermediate layer including an organic emission layer; forming a driving transistor configured to drive the organic light-emitting device, the driving transistor including an active layer, a gate electrode, a source electrode, and a drain electrode; and forming a switching transistor electrically coupled to the driving transistor, the switching transistor including an active layer, a gate electrode, a source electrode, and a drain electrode, wherein the gate electrode of the driving transistor includes a first conductive layer, and a second conductive layer between the first conductive layer and the active layer of the driving transistor, wherein the second conductive layer has a smaller size than the first conductive layer, and the gate electrode of the switching transistor includes a same material as the first conductive layer.

Forming the gate electrode of the driving transistor may further include, after the first conductive layer is formed, forming the second conductive layer by using the first conductive layer as an etch mask.

Forming the second conductive layer may include using a wet etching process.

Forming the second conductive layer may include forming the first conductive layer and a preliminary second conductive layer between the first conductive layer and the active layer, and then etching the preliminary second conductive layer.

The preliminary second conductive layer may be larger than the first conductive layer.

The method may further include performing a doping process on the active layer of the driving transistor, wherein the doping process may include using the first conductive layer of the gate electrode of the driving transistor as a doping mask.

During the doping process, a conduction portion may be formed on the first electrode and may include the same material as the first conductive layer, wherein the conduction portion may be configured to be used as a doping blocking member.

The first electrode and the second conductive layer of the driving transistor may include a same material and may be on a same layer.

The method may further include forming a capacitor in each of the pixels, wherein the capacitor may include a first capacitor electrode and a second capacitor electrode, the first capacitor electrode may include the same material as the first conductive layer and may be formed concurrently with the first conductive layer, and the second capacitor electrode may include a same material as the source electrode and drain electrode of the driving transistor or the source electrode and drain electrode of the switching transistor, and the second capacitor electrode may be formed concurrently with the source electrode and drain electrode of the driving transistor or the source electrode and drain electrode of the switching transistor.

BRIEF DESCRIPTION OF THE DRAWINGS

The above and other features and aspects of the present invention will become more apparent by describing in some detail example embodiments thereof with reference to the attached drawings in which:

FIGS. 7A to 7E are diagrams illustrating a method of manufacturing the organic light-emitting display apparatus of FIG. 6.

DETAILED DESCRIPTION

The structure and operation of the present invention are described in more detail by referring to embodiments of the present invention.

Figure 1:
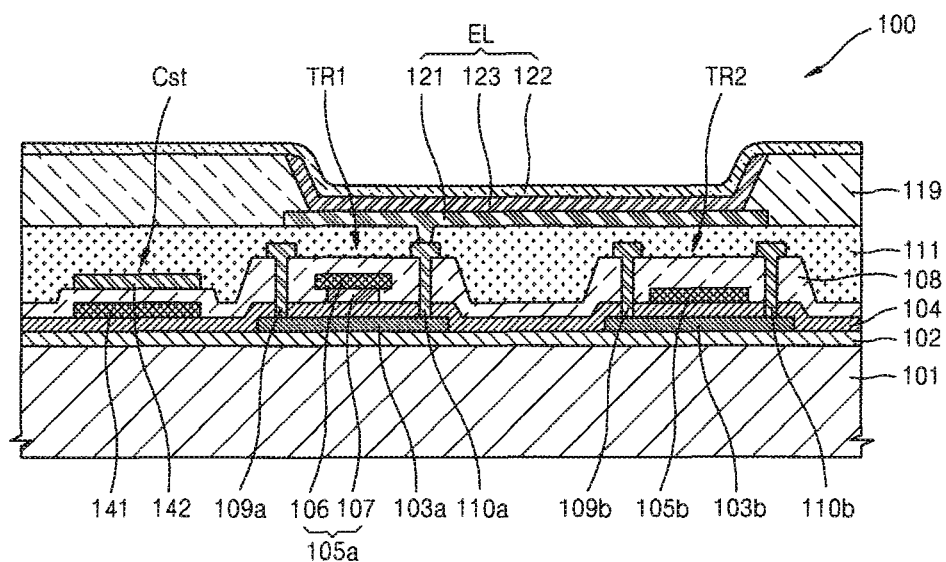
FIG. 1 is a schematic cross-sectional view of an organic light-emitting display apparatus according to an embodiment of the present invention.
Figure 2:
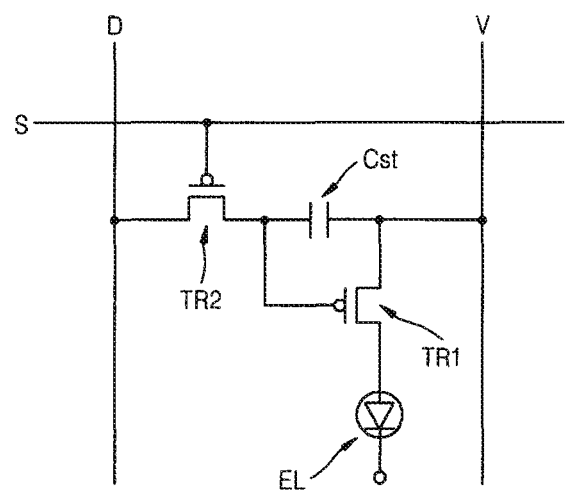
FIG. 2 is a circuit diagram schematically illustrating a pixel of the organic light-emitting display apparatus of FIG. 1.

FIG. 1 is a schematic cross-sectional view of an organic light-emitting display apparatus 100 according to an embodiment of the present invention, and FIG. 2 is a circuit diagram schematically illustrating a pixel of the organic light-emitting display apparatus 100 of FIG. 1.

The organic light-emitting display apparatus 100 includes a plurality of pixels (not shown) on a substrate 101. For convenience of explanation, only one pixel is illustrated in FIGS. 1 and 2.

Referring to FIGS. 1 and 2, a pixel of the organic light-emitting display apparatus 100 includes a driving transistor (TR) TR1, a switching TR TR2, a capacitor Cst, and an organic light-emitting device EL.

The driving TR TR1 includes an active layer 103a, a gate electrode 105a, a source electrode 109a, and a drain electrode 110a. The switching TR TR2 includes an active layer 103b, a gate electrode 105b, a source electrode 109b, and a drain electrode 110b. The capacitor Cst includes a first capacitor electrode 141 and a second capacitor electrode 142. The organic light-emitting device EL includes a first electrode 121, a second electrode 122, and an intermediate layer 123.

As illustrated in FIG. 2, one pixel is coupled to a scan line S extending in a first direction, and a data line D extending in a second direction crossing the first direction. The data line D allows a data signal provided by a data driving unit (not shown) to be applied to the switching TR TR2. Also, the scan line S allows a scan signal provided by a scan driving unit (not shown) to be applied the switching TR TR2. Also, a power supply line V allows a voltage provided by the power driving unit (not shown) to be applied to the organic light-emitting device EL.

Data signals are transmitted to the driving TR TR1 through the switching TR TR2, and the driving TR TR1 drives the organic light-emitting device EL in correspondence to the data signals. In this regard, the capacitor Cst may maintain data voltage constant for a period of time (e.g., a predetermined period of time).

However, the structure illustrated in FIG. 2 is only an example, and the organic light-emitting display apparatus 100 may additionally include a TR (not shown) other than the switching TR TR2 and the driving TR TR1 to compensate for a threshold voltage of the driving TR TR1, and a capacitor (not shown) other than the capacitor Cst.

Structures of the respective members are described in more detail below.

The substrate 101 may be formed of a transparent glass material including $SiO_2$ as a major component. However, a material for forming the substrate 101 is not limited thereto, and for example, a transparent plastic material may also be used. In this regard, a plastic material that forms the substrate 101 may be at least one selected from various suitable organic materials.

A buffer film 102 is formed on the substrate 101. The buffer film 102 may prevent or substantially prevent permeation of impurity elements through the substrate 101 and provides a relatively flat or planar surface on the substrate 101, and may be formed of any one of various suitable materials that provide such properties. For example, the buffer film 102 may include an inorganic material, such as silicon oxide, silicon nitride, silicon oxynitride, aluminum oxide, aluminum nitride, titanium oxide, or titanium nitride, or an organic material, such as polyimide, polyester, or acryl, and these materials may be formed as a plurality of stacks or layers for use as the buffer film 102.

In one embodiment, the buffer film 102 may be omitted according to process conditions.

The active layer 103a of the driving TR TR1 and the active layer 103b of the switching TR TR2 may be formed on the buffer film 102. The active layer 103a and the active layer 103b may be formed of an identical or substantially similar material, for example, an inorganic material, such as silicon material, an organic semiconductor material, or oxide semiconductor material.

A gate insulating film 104 covering the active layer 103a and the active layer 103b is formed on the buffer film 102. The gate insulating film 104 may be formed of various suitable insulating materials, for example, an oxide or a nitride.

The gate electrode 105a of the driving TR TR1, the gate electrode 105b of the switching TR TR2, and the first capacitor electrode 141 are formed on the gate insulating film 104.

The gate electrode 105a of the driving TR TR1 includes a first conductive layer 106 and a second conductive layer 107. The first conductive layer 106 is formed on the second conductive layer 107. That is, the second conductive layer 107 is formed on the gate insulating film 104, and the first conductive layer 106 is formed on the second conductive layer 107.

Also, the second conductive layer 107 may have a smaller width than the first conductive layer 106. In more detail, the first conductive layer 106 may protrude over opposite sides of the second conductive layer 107. That is, an overlapping region of the second conductive layer 107 and the active layer 103a is smaller than an overlapping region of the first conductive layer 106 and the active layer 103a.

The second conductive layer 107 includes a transmissive conductive material, and in more detail, the second conductive layer 107 may be formed of ITO, IZO, ZnO, In$_2$O$_3$, IGO, or AZO.

The first conductive layer 106 may be formed of a material with a lower electric resistance than the second conductive layer 107. Also, the first conductive layer 106 may include metal or an alloy thereof, such as Mo, MoW, or Al-based alloy, but a material for forming first conductive layer 106 is not limited thereto. Also, the first conductive layer 106 may have a single-layer structure or a stack (e.g., multiple layer) structure of Mo/Al/Mo.

The gate electrode 105b of the switching TR TR2 may be formed on the gate insulating film 104. The gate electrode 105b may be formed of the same material as used in forming the first conductive layer 106 of the gate electrode 105a of the driving TR TR1. Also, like the first conductive layer 106, the gate electrode 105b may have a single-layer structure or a stack structure of Mo/Al/Mo.

The first capacitor electrode 141 may be formed on the gate insulating film 104. The first capacitor electrode 141 may be formed of the same material as used in forming the first conductive layer 106 of the gate electrode 105a of the driving TR TR1.

An interlayer insulating film 108 is formed on the gate electrode 105a, the gate electrode 105b, and the first capacitor electrode 141. The interlayer insulating film 108 may be formed of various insulating materials.

The source electrode 109a of the driving TR TR1, the drain electrode 110a of the driving TR TR1, the source electrode 109b of the switching TR TR2, the drain electrode 110b of the switching TR TR2, and the second capacitor electrode 142 are formed on the interlayer insulating film 108.

The source electrode 109a of the driving TR TR1 and the drain electrode 110a of the driving TR TR1 may be coupled to the active layer 103a of the driving TR TR1. The source electrode 109a of the driving TR TR1 and the drain electrode 110a of the driving TR TR1 may be formed of various suitable conductive materials, and may be formed of metal, such as Au, Pd, Pt, Ni, Rh, Ru, Ir, Os, Al, Mo, Nd, Mo, W, or an alloy of at least two of these, but a material for forming the source electrode 109a and the drain electrode 110a is not limited thereto.

The source electrode 109b of the switching TR TR2 and the drain electrode 110b of the switching TR TR2 may be coupled to the active layer 103b of the switching TR TR2. The source electrode 109b of the switching TR TR2 and the drain electrode 110b of the switching TR TR2 may be formed of various materials, and may be formed of metal, such as Au, Pd, Pt, Ni, Rh, Ru, Ir, Os, Al, Mo, Nd, Mo, W, or an alloy of at least two of these, but a material for forming the source electrode 109b and the drain electrode 110b is not limited thereto.

The second capacitor electrode 142 may be formed to overlap with the first capacitor electrode 141 by using Au, Pd, Pt, Ni, Rh, Ru, Ir, Os, Al, Mo, Nd, Mo, W, or an alloy of two or more of these, but a material for forming the second capacitor electrode 142 is not limited thereto.

A passivation layer 111 is formed on the capacitor Cst, the driving TR TR1, and the switching TR TR2. The passivation layer 111 may be formed of an insulating material.

The first electrode 121 of the organic light-emitting device EL is formed on the passivation layer 111. In more detail, the first electrode 121 is coupled to the drain electrode 110a of the driving TR TR1. Also, when the first electrode 121 acts as an anode, a material for forming the first electrode 121 may include a material with high work function, such as ITO, IZO, ZnO, or In$_2$O$_3$. Also, depending on the purpose or design, the first electrode 121 may further include a reflective film formed of Ag, Mg, Al, Pt, Pd, Au, Ni, Nd, Ir, Cr, Li, Yb, or Ca.

A pixel define film 119 is formed on the first electrode 121. In more detail, the pixel define film 119 has an opening corresponding to a top surface of the first electrode 121, and the intermediate layer 123 is formed in the opening to contact the top surface of the first electrode 121.

The intermediate layer 123 includes an organic emission layer to emit visible light. Also, optionally, the intermediate layer 123 may further include at least one layer selected from a hole transport layer, a hole injection layer, an electron transport layer, and an electron injection layer.

The second electrode 122 is formed on the intermediate layer 123. When the second electrode 122 acts as a cathode, the second electrode 122 may be formed of metal, such as Ag, Mg, Al, Pt, Pd, Au, Ni, Nd, Ir, Cr, Li, or Ca. Also, the second electrode 122 may include ITO, IZO, ZnO, or In$_2$O$_3$ to enable transmission of light.

Also, although not illustrated herein, an encapsulation member (not shown) may be further positioned on the second electrode 122 to protect, for example, the organic light-emitting device EL, and the encapsulation member (not shown) may be formed of an organic material or an inorganic material, and may have a single-layer structure or a multi-layer structure, or a stack structure including an organic material and an inorganic material.

In the present embodiment, the first electrode 121 is an anode and the second electrode 122 is a cathode. However, the present invention is not limited thereto, and for example, the first electrode 121 may act as a cathode and the second electrode 122 may act as an anode, and materials for forming the first electrode 121 and the second electrode 122 may vary correspondingly.

In the organic light-emitting display apparatus 100 according to the present embodiment, the gate electrode 105a of the driving TR TR1 is different from the gate electrode 105b of the switching TR TR2 in terms of shape.

The organic light-emitting display apparatus 100 will be described in more detail with reference to FIG. 3.

Figure 3:
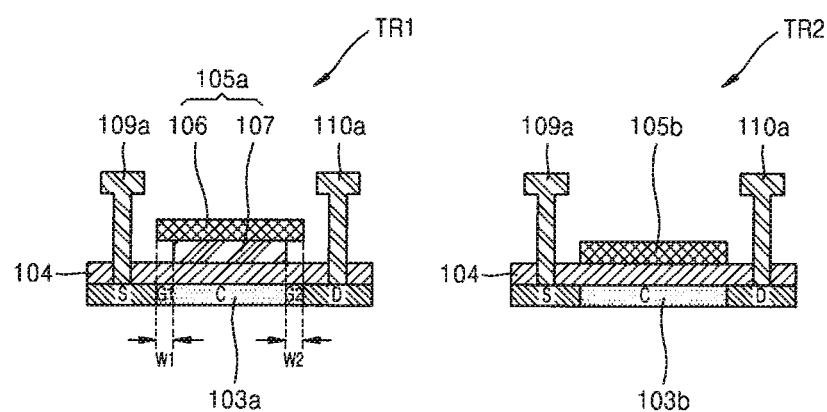
FIG. 3 illustrates a driving TR and a switching transistor (TR) illustrated in FIG. 1.

FIG. 3 illustrates a driving TR and a switching TR illustrated in FIG. 1.

First, regarding the switching TR TR2, the active layer 103b includes a channel region C corresponding to (e.g., at least partially vertically aligned with) the gate electrode 105b, a source region S corresponding to (e.g., at least partially vertically aligned with) the source electrode 109b, and a drain region D corresponding to (e.g., at least partially vertically aligned with) the drain electrode 110b.

Then, regarding the driving TR TR1, the active layer 103a includes a channel region C corresponding to (e.g., at least partially vertically aligned with) the second conductive layer 107 of the gate electrode 105a, a source region S corresponding to (e.g., at least partially vertically aligned with) the source electrode 109a, and a drain region D corresponding to (e.g., at least partially vertically aligned with) the drain electrode 110a. Also, the active layer 103a includes intermediate regions G1 and G2, respectively corresponding to width differences W1 and W2 of the first conductive layer 106 and the second conductive layer 107 in a direction. The intermediate regions G1 and G2 of the active layer 103a may act as a resistor of the driving TR TR1. In particular, when a doping process is performed on the active layer 103a, the first conductive layer 106 may act as a doping mask so that the intermediate regions G1 and G2 may not be doped.

Thus, a voltage applied to the channel region C of the active layer 103a is lower than a voltage Vgs applied between the gate electrode 105a and the source electrode 109a. Accordingly, compared to a case in which the intermediate regions G1 and G2 are not formed, a current Ids flowing between the source electrode 109a and the drain electrode 110a of the driving TR TR1 is reduced.

Therefore, S.S (sub-threshold swing) value of the driving TR TR1 increases. That is, when the voltage is a threshold voltage or lower, the slope of the IV curve decreases. On the other hand, a S.S value of the switching TR TR2 is smaller than that of the driving TR TR1. That is, when the voltage is a threshold voltage or lower, the slope of the IV curve increases.

This will be described in more detail in connection with FIGS. 4 and 5.

Figure 4:
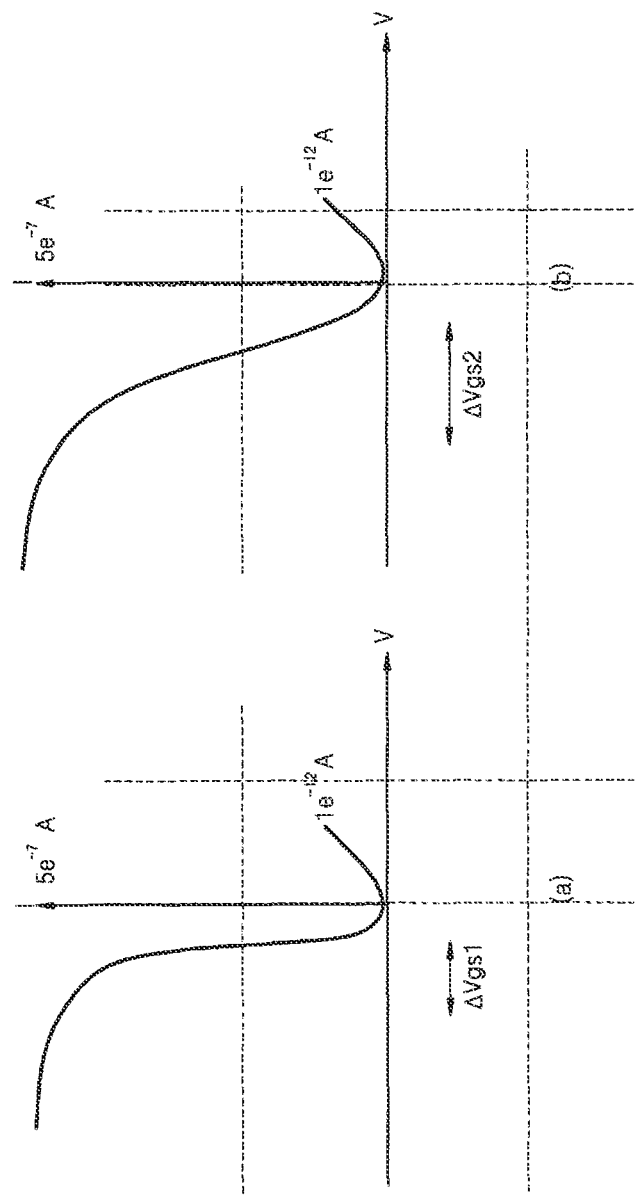
FIG. 4 is a diagram illustrating characteristics of the driving TR illustrated in FIG. 1.

FIG. 4 is a diagram to explain characteristics of the driving TR illustrated in FIG. 1. FIG. 4 shows a IV curve, and FIG. 4(a) corresponds to a case in which the driving TR TR1 has a low S.S value, and FIG. 4(b) corresponds to a case in which the driving TR TR1 has a high S.S value. That is, the driving TR TR1 according to the present embodiment corresponds to FIG. 4(b).

Referring to FIG. 4, if the current range for driving the organic light-emitting display apparatus 100 is assumed to be in a range of about $1e^{-12}$A to $5e^{-7}$A, $\Delta Vgs2$ of FIG. 4(b) is greater than $\Delta Vgs1$ of FIG. 4(a). When the driving TR TR1 has a high S.S value as illustrated in FIG. 4(b), that is, when a IV curve has a gentle slope before a threshold voltage, a voltage margin for the expression of gradation of the organic light-emitting display apparatus 100 is high. That is, the driving TR TR1 according to the present embodiment has a high S.S value so that the organic light-emitting display apparatus 100 may relatively easily express gradation.

Figure 5:
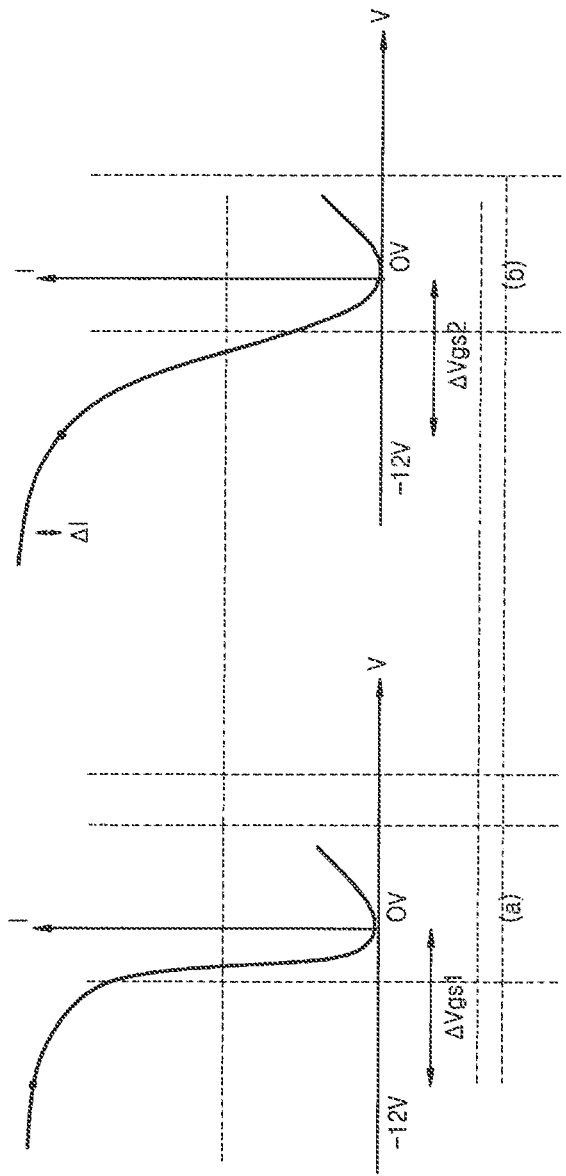
FIG. 5 is a diagram illustrating characteristics of the switching TR illustrated in FIG. 1.

FIG. 5 is a diagram to explain characteristics of the switching TR illustrated in FIG. 1. FIG. 5 shows a IV curve, and FIG. 5(a) corresponds to a case in which the switching TR TR2 has a low S.S value, and FIG. 5(b) corresponds to a case in which the switching TR TR2 has a high S.S value.

That is, the switching TR TR2 according to the present embodiment corresponds to FIG. 5(a).

Referring to FIG. 5, regarding the organic light-emitting display apparatus 100, $\Delta Vgs1$ of FIG. 5(a) is the same as $\Delta Vgs2$ of FIG. 5(b), which corresponds to a case in which the S.S value is high, has a current difference of $\Delta I$ compared to FIG. 5(a) due to the increase in resistance. That is, the switching TR TR2 of FIG. 5(b) may experience a voltage drop and thus, characteristics of the switching TR TR2 decreases. In particular, to additionally compensate for the voltage drop, the swing range of the switching TR TR2 may need to be widened or the driving time may be increased, and additionally, voltage drop may occur due to a kickback phenomenon. The switching TR TR2 of the organic light-emitting display apparatus 100 according to the present embodiment, unlike the driving TR TR1, may have a low S.S value due to the relative absence of the resistance occurring due to the intermediate regions G1 and G2. By doing so, characteristics of the switching TR TR2 may be improved.

Also, the organic light-emitting display apparatus 100 according to the present embodiment, the second conductive layer 107 of the gate electrode 105a of the driving TR TR1 is formed of a transmissive conductive material with a greater resistance than the first conductive layer 106, and thus, due to the increase in resistance, a S.S value thereof is increased. Also, because the gate electrode 105b of the switching TR TR2 is formed of the same material as used to form the first conductive layer 106 instead of the transmissive conductive material, the resistance thereof is decreased and thus, a S.S value thereof is decreased.

The driving TR TR1 and the switching TR TR2 organic light-emitting display apparatus 100 according to the present embodiment have different shapes. Due to the difference in shape, characteristics of the driving TR TR1 and the switching TR TR2 may be differently controlled. That is, without a decrease in characteristics of the switching TR TR2, characteristics of the driving TR TR1 may be improved. That is, without a decrease in data signal characteristics of the switching TR TR1, a voltage margin for the expression of gradation is increased and thus, image-quality characteristics of an organic light-emitting display apparatus may be relatively easily improved.

Figure 6:
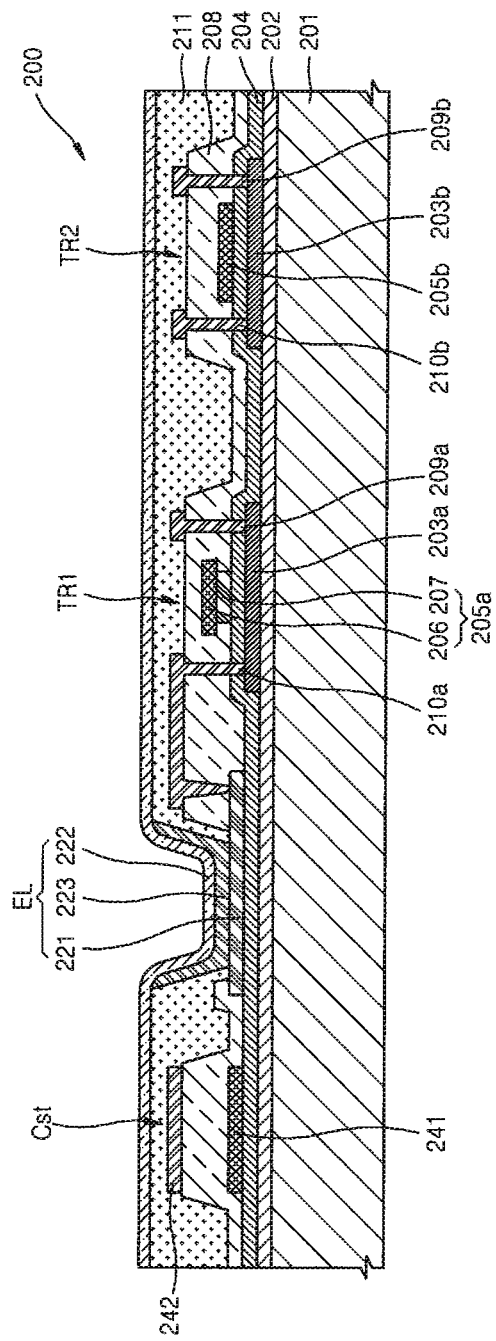
FIG. 6 is a schematic cross-sectional view of an organic light-emitting display apparatus according to another embodiment of the present invention.

FIG. 6 is a schematic cross-sectional view of an organic light-emitting display apparatus 200 according to another embodiment of the present invention.

The organic light-emitting display apparatus 200 includes a plurality of pixels (not shown) on a substrate 201. For the convenience of explanation, only one pixel is illustrated in FIG. 6.

Referring to FIG. 6, a pixel of the organic light-emitting display apparatus 200 includes a driving transistor TR1, a switching TR TR2, a capacitor Cst, and an organic light-emitting device EL. For convenience of explanation, FIG. 6 illustrates only one pixel.

The driving TR TR1 includes an active layer 203a, a gate electrode 205a, a source electrode 209a, and a drain electrode 210a. The switching TR TR2 includes an active layer 203b, a gate electrode 205b, a source electrode 209b, and a drain electrode 210b. The capacitor Cst includes a first capacitor electrode 241 and a second capacitor electrode 242. The organic light-emitting device EL includes a first electrode 221, a second electrode 222, and an intermediate layer 223.

The data signal is transmitted to the driving TR TR1 through the switching TR TR2, and the driving TR TR1 drives the organic light-emitting device EL according to the data signal. In this regard, the capacitor Cst may maintain the data voltage constant for a period of time (e.g., a predetermined period of time).

A buffer film 202 is formed on the substrate 201. In one embodiment, the buffer film 102 may be omitted according to process conditions.

The active layer 203a of the driving TR TR1 and the active layer 203b of the switching TR TR2 may be formed on the buffer film 202. The active layer 203a and the active layer 203b may be formed of an identical (or substantially similar) material.

A gate insulating film 204 covering the active layer 203a and the active layer 203b is formed on the buffer film 202.

The gate electrode 205a of the driving TR TR1, the gate electrode 205b of the switching TR TR2, and the first capacitor electrode 241 are formed on the gate insulating film 204.

The gate electrode 205a of the driving TR TR1 includes a first conductive layer 206 and a second conductive layer 207. The first conductive layer 206 is formed on the second conductive layer 207. That is, the second conductive layer 207 is formed on the gate insulating film 204, and the first conductive layer 206 is formed on the second conductive layer 207.

Also, the second conductive layer 207 may have a smaller width than the first conductive layer 206. That is, the first conductive layer 206 may protrude over opposite sides of the second conductive layer 207. That is, an overlapping region of the second conductive layer 207 and the active layer 203a is smaller than an overlapping region of the first conductive layer 206 and the active layer 203a.

The second conductive layer 207 includes a transmissive conductive material, and in more detail, the second conductive layer 207 may be formed of ITO, IZO, ZnO, $In_2O_3$, IGO, or AZO.

The first conductive layer 206 may include metal or an alloy thereof, such as Mo, MoW, or Al-based alloy, but a material for forming first conductive layer 106 is not limited thereto. Also, the first conductive layer 206 may have a single-layer structure or a stack (e.g., multiple layer) structure of Mo/Al/Mo.

The gate electrode 205b of the switching TR TR2 may be formed on the gate insulating film 204. The gate electrode 205b may be formed of the same material as used in forming the first conductive layer 206 of the gate electrode 205a of the driving TR TR1. Also, like the first conductive layer 206, the gate electrode 105b may have a single-layer structure or a stack (e.g., multiple layer) structure of Mo/Al/Mo.

The first capacitor electrode 241 may be formed on the gate insulating film 204. The first capacitor electrode 241 may be formed of the same material as used in forming the first conductive layer 206 of the gate electrode 205a of the driving TR TR1.

The first electrode 221 may be formed on the gate insulating film 204. The first electrode 221 may include a transmissive conductive material, and may be formed of the same material as used in the second conductive layer 207.

An interlayer insulating film 208 is formed on the gate electrode 205a, the gate electrode 205b, the first electrode 221, and the first capacitor electrode 241.

The source electrode 209a of the driving TR TR1, the drain electrode 210a of the driving TR TR1, the source electrode 209b of the switching TR TR2, the drain electrode 210b of the switching TR TR2, and the second capacitor electrode 242 are formed on the interlayer insulating film 208.

The source electrode 209a of the driving TR TR1 and the drain electrode 210a of the driving TR TR1 may be coupled to the active layer 203a of the driving TR TR1. Also, the driving TR TR1 is electrically coupled to the first electrode 221, and for example, the drain electrode 210a is electrically coupled to the first electrode 221.

The source electrode 209b of the switching TR TR2 and the drain electrode 210b of the switching TR TR2 may be coupled to the active layer 203b of the switching TR TR2.

A second capacitor electrode 242 overlaps a first capacitor electrode 241.

A pixel define layer 211 is formed on the capacitor Cst, the driving TR TR1, and the switching TR TR2. The pixel define layer 211 may be formed of an insulating material. The pixel define film 211 exposes a predetermined portion of a top surface of the first electrode 221, and the exposed portion of the first electrode 221 contacts the intermediate layer 223.

The intermediate layer 223 includes an organic emission layer configured to emit visible light.

The second electrode 222 is formed on the intermediate layer 223.

Also, although not illustrated herein, an encapsulation member (not shown) may be further positioned on the second electrode 222 to protect, for example, the organic light-emitting device EL, and the encapsulation member (not shown) may be formed of an organic material or an inorganic material, and may have a single-layer structure or a multi-layer structure, or a stack structure including an organic material and an inorganic material.

In the organic light-emitting display apparatus 200 according to the present embodiment, the gate electrode 205a of the driving TR TR1 is different from the gate electrode 205b of the switching TR TR2 in terms of shape.

That is, regarding the driving TR TR1, the active layer 203a has intermediate regions corresponding to width differences of the conductive layer 206 and the second conductive layer 207 in opposite directions. The intermediate regions of the driving TR TR1 of the active layer 203a act as a resistor. Thus, a voltage applied to the channel region C of the active layer 203a is lower than a voltage Vgs applied between the gate electrode 205a and the source electrode 209a. Accordingly, compared to a case in which the intermediate regions are not formed, a current Ids flowing between the source electrode 209a and the drain electrode 210a of the driving TR TR1 reduces.

Therefore, a S.S value of the driving TR TR1 increases. That is, when the voltage is a threshold voltage or lower, the slope of the IV curve decreases. On the other hand, a S.S value of the switching TR TR2 is smaller than that of the driving TR TR1. That is, when the voltage is a threshold voltage or lower, the slope of the IV curve increases. By doing so, a voltage margin for expression of gradation of the organic light-emitting display apparatus 200 may be relatively easily improved.

However, the switching TR TR2, unlike the driving TR TR1, has a low S.S value, due to the absence of resistance caused by the intermediate regions. By doing so, characteristics of the switching TR TR2 may be improved.

The driving TR TR1 and the switching TR TR2 organic light-emitting display apparatus 200 according to the present embodiment have different shapes. Due to the difference in shape, characteristics of the driving TR TR1 and the switching TR TR2 may be differently controlled. That is, without a decrease in characteristics of the switching TR TR2, characteristics of the driving TR TR1 may be improved. That is, without a decrease in data signal characteristics of the switching TR TR1, a voltage margin for the expression of gradation is increased and thus, image-quality characteristics of an organic light-emitting display apparatus may be relatively easily improved.

FIGS. 7A to 7E are diagrams illustrating a method of manufacturing the organic light-emitting display apparatus 200 of FIG. 6

Figure 7A:
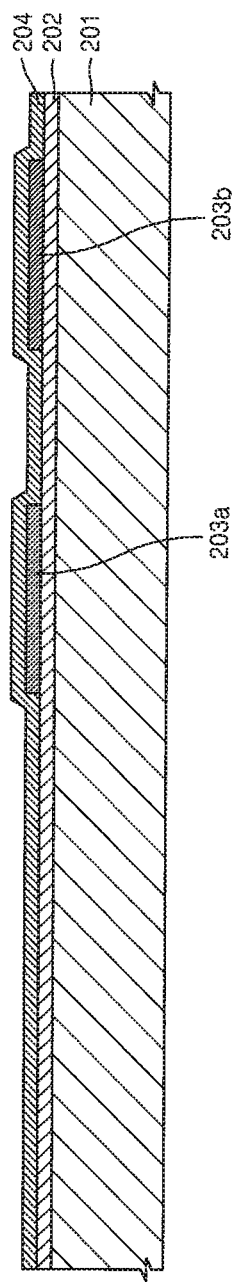

First, referring to FIG. 7A, the buffer film 202 is formed on the substrate 201. The active layer 203a of the driving TR TR1 and the active layer 203b of the switching TR TR2 are formed on the buffer film 202. The active layer 203a and the active layer 203b may be formed of an identical material. A gate insulating film 204 covering the active layer 203a and the active layer 203b is formed on the buffer film 202.

Figure 7B:
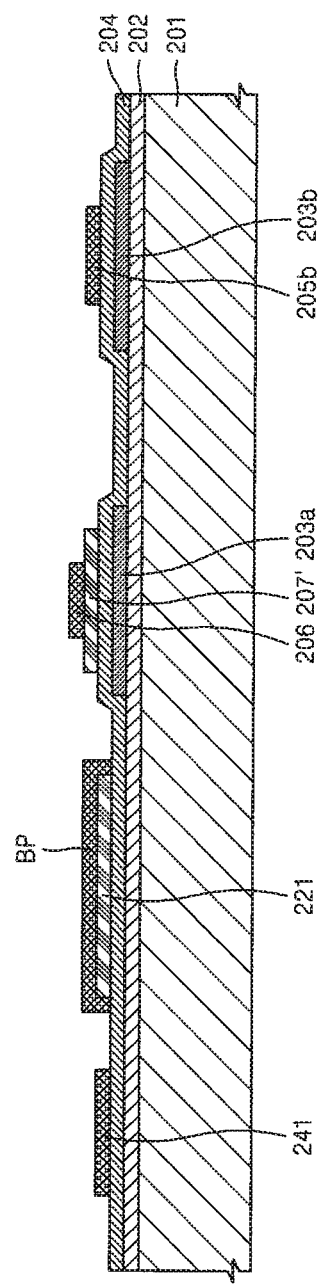

Then, referring to FIG. 7B, the first conductive layer 206 of the gate electrode 205a of the driving TR TR1 is formed on the gate insulating film 204. In more detail, a preliminary second conductive layer 207' and the first conductive layer 206 of the gate electrode 205a of the driving TR TR1 are formed. The preliminary second conductive layer 207' may have a greater width than the first conductive layer 206.

Also, the gate electrode 205b of the switching TR TR2, the first electrode 221, and the first capacitor electrode 241 are formed on the gate insulating film 204. Also, a conduction portion BP is formed on the first electrode 221, and the conduction portion BP and the first conductive layer 206 may be formed of an identical (or substantially similar) material. The conduction portion BP may act as a doping blocking member for the first electrode 221 when a doping process is performed on the active layer 203a and the active layer 203b. In a subsequent process, the conduction portion BP may be completely or partially removed to expose at least a top surface of the first electrode 221.

Also, when a doping process is performed on the active layer 203a and the active layer 203b, the first conductive layer 206 and the gate electrode 205b may act as a doping mask. Therefore, intermediate regions (see G1 and G2 of FIG. 3) of the active layer 203a of the driving TR TR1 may not be doped to increase the resistance of the intermediate regions.

Thereafter, referring to FIG. 7C, an etching process, for example, a wet etching process, may be performed on the resultant structure by using the first conductive layer 206 as a mask without use of a separate mask, so as to etch the preliminary second conductive layer 207' until a desired portion thereof is removed, thereby forming the second conductive layer 207. By doing this, the gate electrode 205a of the driving TR TR1 is formed.

A time for the etching process is controlled such that the second conductive layer 207 has a smaller width than the first conductive layer 206. That is, the first conductive layer 206 may protrude over opposite sides of the second conductive layer 207. That is, an overlapping region of the second conductive layer 207 and the active layer 203a is smaller than an overlapping region of the first conductive layer 206 and the active layer 203a.

Thereafter, referring to FIG. 7D, an interlayer insulating film 208 is formed on the gate electrode 205a, the gate electrode 205b, the first electrode 221, and the first capacitor electrode 241.

The source electrode 209a of the driving TR TR1, the drain electrode 210a of the driving TR TR1, the source electrode 209b of the switching TR TR2, the drain electrode 210b of the switching TR TR2, and the second capacitor electrode 242 are formed on the interlayer insulating film 208.

The source electrode 209a of the driving TR TR1 and the drain electrode 210a of the driving TR TR1 may be coupled to the active layer 203a of the driving TR TR1. Also, the driving TR TR1 is electrically coupled to the first electrode 221, and for example, the drain electrode 210a is electrically coupled to the first electrode 221.

The source electrode 209b of the switching TR TR2 and the drain electrode 210b of the switching TR TR2 may be coupled to the active layer 203b of the switching TR TR2.

A second capacitor electrode 242 overlaps a first capacitor electrode 241.

A pixel define layer 211 is formed on the capacitor Cst, the driving TR TR1, and the switching TR TR2. The pixel define layer 211 may be formed of an insulating material. Also, the pixel define film 211 is formed to expose a portion (e.g., a predetermined portion) of a top surface of the first electrode 221.

Figure 7E:
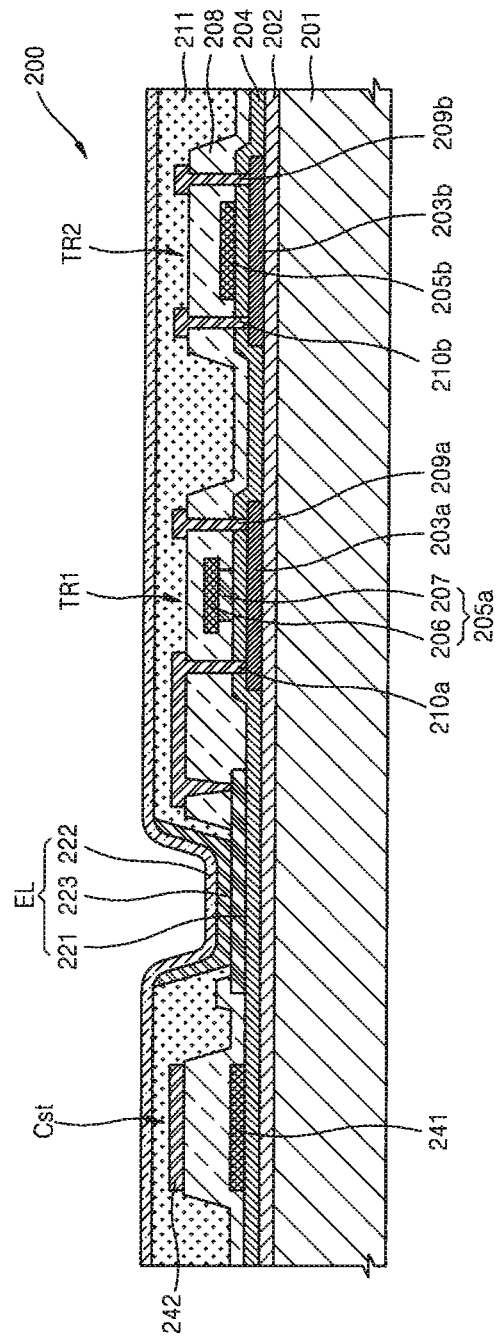

Referring to FIG. 7E, the intermediate layer 223 is formed to contact the top surface of the first electrode 221. The second electrode 222 is formed on the intermediate layer 223 to complete the manufacturing of the organic light-emitting display apparatus 200.

In the organic light-emitting display apparatus 200 according to the present embodiment, the gate electrode 205a of the driving TR TR1 is different from the gate electrode 205b of the switching TR TR2 in terms of shape. That is, without a separate mask, the first conductive layer 106 of the gate electrode 105a is used as an etch mask, and the etching time is controlled to relatively easily form the second conductive layer 107 to have a smaller size than the first conductive layer 106. By doing this, the SS value of the driving TR TR1 is relatively easily increased, thereby improving expression of gradation of the organic light-emitting display apparatus 200.

That is, according to the method according to the present embodiment, the driving TR TR1 and the switching TR TR2 included in the organic light-emitting display apparatus 200 have different shapes and characteristics of the driving TR TR1 and the switching TR TR2 are differently controlled. That is, without a decrease in characteristics of the switching TR TR2, characteristics of the driving TR TR1 may be improved. That is, without a decrease in data signal characteristics of the switching TR TR1, a voltage margin for the expression of gradation is increased and thus, image-quality characteristics of an organic light-emitting display apparatus may be relatively easily improved.

While the present invention has been particularly shown and described with reference to exemplary embodiments thereof, it will be understood by those of ordinary skill in the art that various changes in form and details may be made therein without departing from the spirit and scope of the present invention as defined by the following claims, and their equivalents.

What is claimed is:
1. An organic light-emitting display apparatus comprising:
   a substrate; and
   a plurality of pixels on the substrate, wherein each of the pixels comprises:
      an organic light-emitting device comprising a first electrode, a second electrode, and an intermediate layer between the first electrode and the second electrode, wherein the intermediate layer comprises an organic emission layer;
      a driving transistor configured to drive the organic light-emitting device and comprising an active layer, a gate electrode, a source electrode, and a drain electrode; and a switching transistor electrically coupled to the driving transistor and comprising an active layer, a gate electrode, a source electrode, and a drain electrode, wherein the gate electrode of the driving transistor comprises a first conductive layer, and a second conductive layer between the first conductive layer and the active layer of the driving transistor and has a smaller width along a direction parallel to a surface of the substrate than the first conductive layer, and the gate electrode of the switching transistor comprises a same material as the first conductive layer.

2. The organic light-emitting display apparatus of claim 1, wherein the first conductive layer protrudes over opposite sides of the second conductive layer.

3. The organic light-emitting display apparatus of claim 1, wherein an overlapping region of the second conductive layer and the active layer of the driving transistor is smaller than an overlapping region of the first conductive layer and the active layer of the driving transistor.

4. The organic light-emitting display apparatus of claim 1, wherein the second conductive layer comprises a transmissive conductive material.

5. The organic light-emitting display apparatus of claim 4, wherein the transmissive conductive material comprises ITO, IZO, ZnO, $In_2O_3$, IGO, or AZO.

6. The organic light-emitting display apparatus of claim 1, wherein an electrical resistance of the first conductive layer is smaller than an electric resistance of the second conductive layer.

7. The organic light-emitting display apparatus of claim 1, wherein each of the pixels further comprises a capacitor.

8. The organic light-emitting display apparatus of claim 7, wherein the capacitor comprises a first capacitor electrode and a second capacitor electrode, wherein the first capacitor electrode comprises the same material as the first conductive layer, and the second capacitor electrode comprises a same material as the source electrode and drain electrode of the driving transistor or the source electrode and drain electrode of the switching transistor.

9. The organic light-emitting display apparatus of claim 1, wherein the first electrode and the second conductive layer of the driving transistor are formed on a same layer.

10. The organic light-emitting display apparatus of claim 1, wherein the first electrode is formed of a same material as in the second conductive layer of the driving transistor.

11. The organic light-emitting display apparatus of claim 1, wherein a portion of the active layer of the driving transistor that corresponds to the first conductive layer and does not correspond to the second conductive layer is a non-doped portion.

12. A method of manufacturing an organic light-emitting display apparatus, the organic light-emitting display apparatus comprising a plurality of pixels on a substrate, the method comprising:

forming one of the pixels, the forming of one of the pixels comprising:

forming an organic light-emitting device comprising a first electrode, a second electrode, and an intermediate layer between the first electrode and the second electrode, the intermediate layer comprising an organic emission layer;

forming a driving transistor configured to drive the organic light-emitting device, the driving transistor comprising an active layer, a gate electrode, a source electrode, and a drain electrode; and forming a switching transistor electrically coupled to the driving transistor, the switching transistor comprising an active layer, a gate electrode, a source electrode, and a drain electrode, wherein the gate electrode of the driving transistor includes a first conductive layer, and a second conductive layer between the first conductive layer and the active layer of the driving transistor, wherein the second conductive layer has a smaller width along a direction parallel to a surface of the substrate than the first conductive layer, and the gate electrode of the switching transistor comprises a same material as the first conductive layer.

13. The method of claim 12, wherein forming the gate electrode of the driving transistor further comprises, after the first conductive layer is formed, forming the second conductive layer by using the first conductive layer as an etch mask.

14. The method of claim 13, wherein forming the second conductive layer comprises using a wet etching process.

15. The method of claim 13, wherein forming the second conductive layer comprises forming the first conductive layer and a preliminary second conductive layer between the first conductive layer and the active layer, and then etching the preliminary second conductive layer.

16. The method of claim 15, wherein the preliminary second conductive layer is larger than the first conductive layer.

17. The method of claim 12, further comprising performing a doping process on the active layer of the driving transistor, wherein the doping process comprises using the first conductive layer of the gate electrode of the driving transistor as a doping mask.

18. The method of claim 17, wherein during the doping process, a conduction portion is formed on the first electrode and comprises the same material as the first conductive layer, where the conduction portion is configured to be used as a doping blocking member.

19. The method of claim 12, wherein the first electrode and the second conductive layer of the driving transistor comprise a same material and are formed on a same layer.

20. The method of claim 12, further comprising forming a capacitor in each of the pixels, wherein the capacitor comprises a first capacitor electrode and a second capacitor electrode, the first capacitor electrode comprises the same material as the first conductive layer and is formed concurrently with the first conductive layer, and the second capacitor electrode comprises a same material as the source electrode and drain electrode of the driving transistor or the source electrode and drain electrode of the switching transistor, and the second capacitor electrode is formed concurrently with the source electrode and drain electrode of the driving transistor or the source electrode and drain electrode of the switching transistor.

* * * * *